Nov. 5, 1963 J. BAUDE 3,109,940
COMPOUND CASCADE TRANSISTOR SWITCH HAVING NONLINEAR RESISTANCE THERMAL RUNAWAY PROTECTION
Filed May 21, 1959
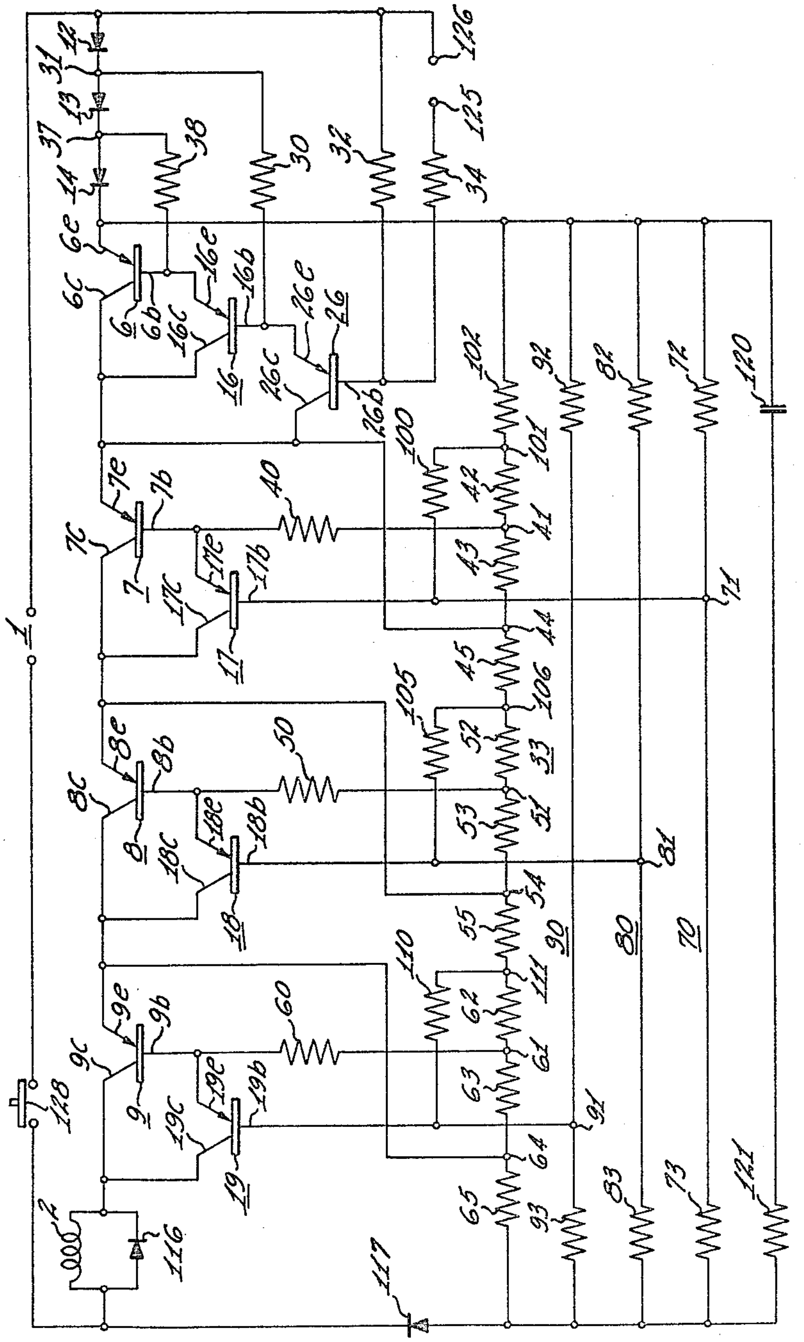
Inventor
John Baude
by Carl A. Lemmann, Jr.
Attorney 3,109,940
Patented Nov. 5, 1963

3,109,940

COMPOUND CASCADE TRANSISTOR SWITCH HAVING NONLINEAR RESISTANCE THERMAL RUNAWAY PROTECTION

John Baude, Milwaukee, Wis., assignor to Allis-Chalmers Manufacturing Company, Milwaukee, Wis.

Filed May 21, 1959, Ser. No. 814,859
7 Claims. (Cl. 307—88.5)

This invention relates generally to transistor switches and in particular to that type of switch designed to control currents or voltage in excess of the ratings of the individual transistors.

The application of transistors as switches has been limited due to the high price or unavailability of transistors capable of handling the voltages and currents involved in industrial control applications. It is not unusual to increase the voltage handling ability of transistors by connecting them in a cascade circuit to divide the voltage between the transistors but the prior art devices have serious limitations.

The problem of thermal runaway at elevated temperatures exists in many of the prior art circuits. While it is true that a transistor may be biased to prevent thermal runaway, this has generally required a power source separate from that which is controlled by the transistor. The requirement of a separate power source is a distinct disadvantage where a transistor switch is to be employed because of the additional size, cost and the decrease in reliability due to the increasing number of component parts.

A short response time materially improves the current handling ability of a transistor switch. The current which a transistor can handle at saturation is much greater than its current capacity in the more linear region. Since the power dissipated within the transistor is responsive to the product of the voltage across the transistor and the current through it, internal dissipation can be kept to a minimum if one of these factors is held to a small value. A transistor switch accomplishes this by reducing the voltage drop across the transistor to a very small value during the time the switch is closed and the current is high. Reducing the current to a small value has the same effect when the switch is open.

During the changeover between conducting and nonconducting states, the internal dissipation becomes quite large since both current and voltage have appreciable value. The faster the switch accomplishes a changeover, the less chance there is that the internal dissipation rating will be exceeded. The maximum power handling rating is therefore increased for switching purposes.

Another requirement for a successful transistor switch is that the control power be minimized. The higher the signal required to change the switch from a conducting state into a nonconducting state, the more expensive and less reliable it becomes. My invention provides a high gain transistor switch in which a minimum of control power is required and which contains a novel biasing arrangement to avoid the necessity for a separate bias supply and the consumption of large amounts of power during the standby period. The circuit of my invention provides complete protection against thermal runaway of any of the transistors contained therein and also provides a high gain to accomplish rapid switching with a minimum of components.

It is therefore an object of my invention to provide a new and improved high speed transistor switch capable of handling voltages in excess of the individual ratings of the transistors.

It is another object of my invention to provide a transistor switch in which the possibility of thermal runaway of any of the transistors is eliminated.

It is a further object of my invention to provide a transistor switch having high gain and a short switching period.

Still another object of my invention is to provide a transistor switch in which the biasing power for all transistors is derived from the circuit being controlled and which requires a minimum amount of biasing power.

Other objects and advantages of this invention will become apparent from the following description taken in connection with the accompanying drawings, wherein are set forth by way of illustration and example certain embodiments of this invention.

In the embodiment shown in the FIGURE a direct current source 1 energizes an inductive load 2 through the emitter collector circuits of PNP junction transistors 6, 7, 8 and 9, and diodes 12, 13 and 14. A connection of transistors that successively switch the same current, such as the transistors 6, 7, 8 and 9, will be called a cascade connection. Control of the cascade connected transistors is effected by means of compound connected transistors 16, 17, 18 and 19.

A trigger transistor 26 of the PNP junction type has its emitter **26*e* connected through resistor 30 to junction 31 between diode 12 and diode 13. Base 26*b* of trigger transistor 26 is connected to the high potential side of diode 12 through resistor 32. Since diode 12 is in series circuit with the emitter and collector of transistors 6, 7, 8 and 9, any leakage current through this circuit will result in a voltage drop across diode 12. In addition, the leakage current through the emitter-collector circuit of transistor 16 and 26 must flow through this diode. In addition to the leakage currents drawn by the transistors mentioned, the current drawn by bias circuit 33 passes through diode 12**.

Diode 12 may be selected to provide an increasing voltage drop for the range of leakage current which exists in the circuit. Since the voltage drop for diode 12 remains constant after a minimum current is reached, a bias voltage is produced which increases throughout the range of leakage current but levels off and remains constant for the load current which flows through the circuit.

Since emitter **26*e* of transistor 26 is connected to junction 31, which is the more negative side of diode 12, the voltage which appears between emitter 26*e* and base 26*b* tends to cut off the flow of current between emitter 26*e* and collector 26*c*. An increase in leakage current between emitter 26*e* and collector 26*c* results in an increased voltage drop across diode 12 tending to reduce the flow of current from emitter 26*e* to collector 26*c***.

This method of biasing transistor 26 protects against the tendency for the emitter-collector leakage current to increase due to a self-induced temperature rise. Without such protective bias the transistor would be subject to thermal runaway. This term is applied to the action of a transistor where the leakage current increases itself due to the heating effect until the dissipation rating is exceeded and the transistor is damaged by the effect of heat.

While it is desirable that the bias voltage be the minimum value required to stabilize the transistor and that this bias voltage vary as required by the leakage current, the problem of stabilization may be solved by selecting a diode which has a maximum voltage drop in the forward direction at very low currents or by increasing the current in bias circuit 33 to a point where a constant voltage drop is obtained across diode 12. With this arrangement, adequate protection is insured despite the fact that the voltage bias across the emitter base electrodes remains constant. This system has the advantage that the leakage current is always maintained at a very low value since the maximum bias is always present.

The value of resistor 32 represents a compromise. It is essential that base 26b of transistor 26 be connected to the positive side of diode 12 to complete the bias circuit. A high value of resistance at this point reduces the effectiveness of diode 12 in controlling the emitter 26e collector 26c leakage current. Any voltage drop across resistor 32 reduces the voltage between the emitter 26e and base 26b and thereby reduces the bias. However, lowering the value of resistor 32 decreases the input impedance of the switch and complicates the trigger circuit requirements.

In some applications, a matching transformer may be used to replace resistor 32. Such a transformer could have a high input impedance to match the control circuit and a low output impedance to satisfy the bias circuit requirements. This modification would reduce the resistance between base 26b and the positive side of diode 12 without reducing the input impedance of trigger transistor 26. Resistor 34 serves as a means for isolating the switch from the control circuit and may not be required in some applications.

A control transistor 16 of the PNP junction type has its base 16b connected through resistor 30 to junction 31 of diode 12 and diode 13. Emitter 16e of transistor 16 is connected to junction 37 of diode 13 and diode 14 through resistor 38. The leakage current through the emitter-collector circuits of transistors 6, 7, 8, 9 and 16 and bias circuit 33 causes a voltage to appear across diode 14. This voltage is impressed between emitter 16e and base 16b of transistor 16 with base 16b being maintained more positive than emitter 16e to hold transistor 16 in the cutoff condition. Should the leakage current for transistor 16 increase, the resultant greater voltage drop across diode 14 applies a greater bias voltage between emitter 16e and base 16b tending to reduce the leakage current flowing between emitter 16e and collector 16c. As in the case of diode 12, circuit values may be modified and a diode 13 selected to provide a maximum bias voltage beginning at the minimum value of leakage current.

Transistor 6, the first of the cascade connected transistors, is biased in a manner similar to transistors 16 and 26. The leakage current through the emitter 6e-collector 6c circuit of transistor 6 and the current through bias circuit 33 must pass through diode 14. The voltage drop across diode 14 is applied between emitter 6e and base 6b of transistor 6 by means of resistor 38. The function of resistor 38 is essentially the same as resistors 30 and 32 described above.

Since the more positive side of diode 14 is connected to base 6b, the bias voltage applied between emitter 6e and base 6b of transistor 6 tends to reduce the current flowing from emitter 6e to collector 6c.

This novel means of biasing trigger transistor 26, control transistor 16 and the first cascade connected transistor 6 places base 6b of transistor 6 at a higher positive potential than emitter 6e despite the fact that emitter 6e is directly connected to power source 1. The use of diodes in series with load 2 results in negligible losses and eliminates the need for a separate bias supply. Diodes 12, 13 and 14 create a bias voltage which may be variable over the normal range of leakage current but which remains constant over a wide range of load currents.

Cascade connected transistor 7 has its base 7b connected through resistor 40 to a point 41 on series voltage divider 33 which is common to resistors 42 and 43. Emitter 7e is connected to point 44 common to resistors 43 and 45. Since point 41 is separated from point 44 by resistor 43, emitter 7e of transistor 7 will be at a potential lower than base 7b by the IR drop across resistor 43. This bias voltage, impressed between emitter and base of transistor 7 blocks the flow of current from emitter 7e to collector 7c.

This analysis ignores any IR drop across resistor 40 in the lead to base 7b of transistor 7. Since this resistance is relatively small and is traversed only by the leakage current through base 7b the voltage drop will be negligible in comparison to the bias voltage and may therefore be ignored.

Cascade connected transistor 8 has its base 8b connected through resistor 50 to the voltage divider 33 at point 51 common to resistors 52 and 53. Emitter 8e of transistor 8 is connected to voltage divider 33 at point 54 common to resistors 53 and 55. Since point 54 is displaced from point 51 to which base 8b is connected, emitter 8e of transistor 8 is at a potential lower than base 8b by the IR drop across resistor 53. Placing emitter 8e at a more negative potential than base 8b blocks the flow of current from emitter 8e to collector 8c.

The last cascade connected transistor 9 has its base 9b connected through resistor 60 to voltage divider 33 at point 61 common to resistors 62 and 63. Emitter 9e of transistor 9 is connected to voltage divider 33 at point 64 common to resistors 63 and 65. As with the other cascade connected transistors, emitter 9e is at a potential lower than the base 9b by the amount of the IR drop across resistor 63. Since emitter 9e is at a more negative potential than base 9b, the flow of current from emitter 9e to the collector 9c is blocked.

PNP junction transistor 17 has collector 17c connected to collector 7c of cascade connected transistor 7 and has emitter 17e connected to base 7b of the transistor 7. A connection of transistors in which the base current of one transistor is the collector current of another transistor, as transistors 7 and 17 are connected, will be called a compound connection. PNP junction transistor 17 has base 17b connected to bias circuit 70 at point 71 common to resistors 73 and 72. The resistors 73 and 72 are proportioned to place point 71 and therefore also base 17b at a potential which cuts off transistor 17 between emitter 17e and collector 17c and properly divides the source voltage between the cascade connected transistors.

PNP junction transistor 18, connected in a compound relation with transistor 8, has base 18b connected to bias circuit 80 at point 81 common to resistors 82 and 83. As in the case of transistor 17, proper proportioning of the resistors 82 and 83 places base 18b of transistor 18 at a potential which cuts off the flow of current between emitter 18e and collector 18c and places the proportionate share of source 1 voltage across emitter 8e and collector 8c of transistor 8.

Bias circuit 90 is connected to base 19b of PNP junction transistor 19 at a point 91, common to resistors 92 and 93. Point 91 is at a potential which places base 19b at the proper potential to cut off the flow of current between emitter 19e and collector 19c and assures that transistor 9 has its proportionate share of the source 1 voltage between emitter 9e and collector 9c.

Resistor 100, connected between point 71 and point 101 which is the junction of resistors 42 and 102, ties in bias circuit 70 and bias circuit 33. While it may not be necessary to interconnect the bias circuits in this manner, such a connection is a precaution against the two circuits getting far out of line.

In a similar manner point 81 on bias circuit 80 is connected through resistor 105 to point 106 on bias circuit 33. Resistor 110 connects point 91 on bias circuit 90 to point 111 on bias circuit 33. While these resistors perform identical functions relative to the circuits they interconnect, the actual values may be different. The resistor size will depend on the unbalance which may be expected and the unbalance which may be tolerated between the compound connected transistors.

Bias circuit 70 is comprised of resistors 72 and 73 with point 71 common to both. Bias circuit 80 is comprised of resistors 82 and 83 with point 81 common to both. Resistors 92 and 93 with point 91 common to both make up bias circuit 90. The resistors in bias circuits 70, 80 and 90 are proportioned to provide the proper voltage division between transistors 17, 18 and 19. Since the transistors 17, 18 and 19 are related to transistors 7, 8 and 9, resistors 100, 105 and 110 are included to tie the two transistor circuits together. These resistors serve to prevent the bias voltage on a control transistor from getting too far out of range relative to the cascade connected transistor with which it is associated.

Bias circuit 33 is completed by resistor 102. Diode 116 helps to minimize the effect of the inductive surge which results when the current through load coil 2 changes abruptly. Unbypassed by diode 116, the inductive surge resulting when the current to the load 2 is cut off could cause damage to the transistors and possible failure of the switch.

Diode 117 in series with bias circuits 70, 80 and 90 performs an isolation function by blocking the inductive surge from load coil 2 to prevent this surge from entering bias circuits 70, 80 and 90 where it might cause damage to the switch.

Capacitor 120 and resistor 121 perform a dual function in this circuit by serving to reduce the amplitude of such transients as may appear across the cascade connected transistors 6, 7, 8 and 9 and also helping to sustain the voltage across the bias circuits during the switching operation. The latter feature is quite important since all power required to complete the switching must come from the voltage drop across the switch which decreases to zero as the switch is closed.

The input signal applied to terminals 125 and 126 may be derived from any suitable source and has a polarity such that the voltage appearing across resistor 32 tends to drive transistor 26 to conduction. In the case of a PNP junction transistor the input signal would make terminal 125 negative and terminal 126 positive, developing a voltage across resistor 32 which makes base **26*b* of the transistor 26 negative, allowing current to flow from emitter 26*e* to collector 26*c***.

This has the effect of connecting base **16*b* of transistor 16 to collector 16*c*, a condition which allows current to flow from emitter 16*e* to collector 16*c*. This state of conduction between emitter 16*e* and collector 16*c* has the effect of connecting base 6*b* of transistor 6 to collector 6*c*. With emitter 16*e* of transistor 16 connected to base 6*b* of transistor 6 and collectors 16*c* and 6*c* in common, it follows that transistor 6 will conduct from emitter 6*e* to collector 6*c* when transistor 16 conducts from emitter 16*e* to collector 16*c***.

When transistors 6, 16 and 26 are in the conducting condition, emitter **7*e* of transistor 7 will be slightly positive with respect to base 7*b*. This condition results in conduction through transistor 7 from emitter 7*e* to collector 7*c*. This places base 7*b* at a higher potential than base 17*b* of transistor 17 since the latter base remained at the same potential while base 7*b*** was raised in potential.

This causes emitter **17*e* of transistor 17 to be at a higher potential than base 17*b*, a condition which results in conduction from emitter 17*e* to collector 17*c***.

The coaction of transistor 8 and transistor 18 is similar to that of transistors 7 and 17. When the emitter **8*e* of transistor 8 reaches the potential of the source, less the voltage drop across diodes 12, 13 and 14 and transistors 6, 16, 7 and 17, it will be at a positive potential with respect to base 8*b*. This is evident from the drawing since any path followed by current from emitter 8*e* to base 8*b*** must pass through a circuit element which induces a voltage drop.

When this condition prevails, transistor 8 will conduct between emitter **8*e* and collector 8*c*. Conduction through transistor 8 raises the potential of emitter 18*e* of transistor 18. With base 18*b* remaining at essentially the same potential, raising emitter 18*e* to a higher potential has the effect of initiating conduction through transistor 18 from emitter 18*e* to collector 18*c***.

The last cascade connected transistor 9 has its emitter **9*e* connected to collector 8*c* of transistor 8. Similar to the case of transistors 6, 7 and 8, raising the potential of emitter 9*e* to a value above that of base 9*b* causes transistor 9 to conduct from the emitter 9*e* to collector 9*c*. The combination of transistors 9 and 19 forms a compound connection similar to that of transistors 8 and 18 and transistors 7 and 17**.

The schematic shows four transistors in the cascade circuit. This number reflects the voltage magnitude of direct current source 1. The number of transistors would be increased if the source voltage were increased or decreased if the voltage of the source were lowered.

Several elements in the circuit contribute to the novel operation of the device. For example, the base resistors 40, 50 and 60 prevent excessive base current from damaging the transistors as the source voltage is impressed across successively fewer transistors during the cycle from off to on. Without resistor 60, for example, the base current which would flow through emitter **9*e* and base 9*b* during switching cycles would quickly damage transistor 9**.

With all transistors in the cascade circuit conducting at saturation level and their compound connected cooperating transistors also in the conductive state, essentially the entire source voltage will appear across the load 2. The drop across the transistors and diodes is small in relation to the total source voltage.

In a typical application of this invention, load 2 would be a circuit breaker trip coil and contacts 128 would be controlled by the circuit breaker to open when the breaker opens. In such an application the contacts 128 would operate to deenergize the switch when the breaker is in the open position.

In the absence of such contacts the transistor switch would open as soon as the signal is removed from the input terminals 125 and 126.

Removal of the signal from terminals 125 and 126 restores the condition of bias between emitter **26*e* and base 26*b* of transistor 26. The voltage drop across diode 12, caused by the load current through the transistors and the current drawn by bias network 33, is impressed between emitter 26*e* and base 26*b* in a manner to make emitter 26*e* negative with respect to base 26*b***.

When this occurs, the flow of current from emitter **26*e* to collector 26*c* of transistor 26 is cut off due to the negative bias developed across diode 12 and impressed between the emitter 26*e* and base 26*b***.

Cutting of the low impedance path between base **16*b* and collector 16*c* of transistor 16 results in cutting off the current flowing between emitter 16*e* and collector 16*c* due to the bias voltage impressed between emitter 16*e* and base 16*b*. This voltage is developed by the current flowing through diode 13. The voltage drop across diode 13 makes emitter 16*e* less positive than base 16*b* thereby cutting off transistor 16 between emitter 16*e* and collector 16*c***.

With transistors 6, 16 and 26 cut off, the normal cutoff bias conditions exist for the remaining transistors and they are cut off as previously described.

The time required to cut off the current flowing through load 2 is so short that a very high reverse voltage is developed by inductive load 2. It has been found that diode 116 in parallel with the inductive load 2 offers a low resistance path to the induced current and thereby reduces the reverse voltage.

Diode 117 prevents the induced current from flowing in the reverse direction through bias circuits 70, 80 and 90.

Despite the presence of these diodes there is still a tendency for abnormally high voltages to appear across transistors 9, 19, 8 and 18 adjacent load 2.

Addition of resistor 121 and capacitor 120 aids materially in reducing the amplitude of the induced voltage across the transistors.

Although but one embodiment of the present invention has been illustrated and described, it will be apparent to those skilled in the art that various changes and modifications may be made therein without departing from the spirit of the invention or from the scope of the appended claims.

Having now particularly described and ascertained the nature of my said invention and the manner in which it is to be performed, I declare that what I claim is:

1. In a transistor switch for controlling the flow of current from a source to a load, first and second groups of transistors, circuit means connecting the emitters and collectors of said first group in cascade circuit to control the flow of current from a source to a load, circuit means individually connecting each of said second group of transistors in compound relation to the transistors of said first group, a first diode in series with said cascade connected transistors and said source, means connecting a first transistor in said first group to said first diode to impress the voltage drop across said diode between the emitter and base of said first transistor tending thereby to diminish the flow of current in the emitter-collector circuit of said first transistor, a second diode in series with a first of said compound connected transistors, means connecting said first compound connected transistor to said second diode between the emitter and base of said first compound connected transistor tending thereby to diminish the flow of current in the emitter-collector circuit of said first compound connected transistor.

2. In a transistor switch for controlling the flow of current from a source to a load, first and second groups of transistors, circuit means connecting the emitters and collectors of said first group in cascade circuit to control the flow of current from a source to a load, circuit means individually connecting each of said second group of transistors in compound relation to the transistors of said first group, a first diode in series with said cascade connected transistors and said source, means connecting a first transistor in said first group to said first diode to impress the voltage drop across said diode between the emitter and base of said first transistor tending thereby to diminish the flow of current in the emitter-collector circuit of said first transistor, a second diode in series with a first of said compound connected transistors, means connecting said first compound connected transistor to said second diode to impress the voltage drop across said second diode between the emitter and base of said first compound connected transistor tending thereby to diminish the flow of current in the emitter-collector circuit of said first compound connected transistor, first bias means for other of said cascade connected transistors comprising a voltage divider energized by the voltage across said switch, means connecting said other of said cascade connected transistors to said first bias means to impress a voltage between the emitter and base of said other transistors tending to diminish the current flowing in the emitter-collector circuits of said other transistors, second bias means for the remaining of said compound connected transistors comprising individual voltage divider means for each of said remaining compound connected transistors, means connecting said individual voltage dividers to be energized by the voltage across said switch, means connecting the bases of the remaining of the said compound connected transistors to said individual voltage dividers to impress a voltage between the emitter and base of said other of said compound connected transistors tending to diminish the current flowing in the emitter-collector circuits of said other of said compound connected transistors.

3. In a transistor switch for controlling the flow of current from a source to a load, first and second groups of transistors, circuit means connecting the emitters and collectors of said first group in cascade circuit to control the flow of currents from a source to a load, circuit means individually connecting each of said second group of transistors in compound relation to the transistors of said first group, a first diode in series with said cascade connected transistors and said source, means connecting a first transistor in said first group to said first diode to impress the voltage drop across said diode between the emitter and base of said first transistor tending thereby to diminish the flow of current in the emitter-collector circuit of said first transistor, a second diode in series with a first of said compound connected transistors, means connecting said first compound connected transistor to said second diode to impress the voltage drop across said second diode between the emitter and base of said first compound connected transistor tending thereby to diminish the flow of current in the emitter-collector circuit of said first compound connected transistor, first bias means for other of said cascade connected transistors comprising a voltage divider energized by the voltage across said switch, means connecting said other of said cascade connected transistors to said first bias means to impress the voltage between the emitter and base of said other transistors tending to diminish the current flowing in the emitter-collector circuits of said other transistors, second bias means for the remaining of said compound connected transistors comprising individual voltage divider means for each of said remaining compound connected transistors, means connecting said individual voltage dividers to be energized by the voltage across said switch, means connecting the bases of the remaining of the said compound connected transistors to said individual voltage dividers to impress a voltage between the emitter and base of said other of said compound connected transistors tending to diminish the current flowing in the emitter-collector circuits of said other of said compound connected transistors, means for initiating conduction through said switch comprising circuit means connected to the collector and base of said first of said compound connected transistors for effectively shorting said collector to said base.

4. In a transistor switch for controlling the flow of current from a source to a load, first and second groups of transistors, circuit means connecting the emitters and collectors of said first group in cascade circuit to control the flow of current from a source to a load, circuit means individually connecting each of said second group of transistors in compound relation to the transistors of said first group, a first diode in series with said cascade connected transistors and said source, means connecting a first transistor in said first group to said first diode to impress the voltage drop across said diode between the emitter and base of said first transistor tending thereby to diminish the flow of current in the emitter-collector circuit of said first transistor, a second diode in series with a first of said compound connected transistors, means connecting said first compound connected transistor to said second diode to impress the voltage drop across said second diode between the emitter and base of said first compound connected transistor tending thereby to diminish the flow of current in the emitter-collector circuit of said first compound connected transistor, first bias means for other of said cascade connected transistors comprising a voltage divider energized by the voltage across said switch, means connecting said other of said cascade connected transistors to said first bias means to impress the voltage between the emitter and base of said other transistors tending to diminish the current flowing in the emitter-collector circuits of said other transistors, second bias means for the remaining of said compound connected transistors comprising individual voltage divider means for each of said remaining compound connected transistors, means connecting said individual voltage dividers to be energized by the voltage across said switch, means connecting the bases of the remaining of the said compound connected transistors to said individual voltage dividers to impress a voltage between the emitter and base of said other of said compound connected transistors tending to diminish the current flowing in the emitter-collector circuits of said other of said compound connected transistors, means for initiating conduction through said switch comprising a trigger transistor having its emitter and collector connected to the base and collector, respectively, of said first of said compound connected transistors, means for causing conduction between the emitter and collector of said trigger transistor.

5. In a transistor switch for controlling the flow of current from a source to a load, first and second groups of transistors, circuit means connecting the emitters and collectors of said first group in cascade circuit to control the flow of current from a source to a load, circuit means individually connecting each of said second group of transistors in compound relation to the transistors of said first group, a first diode in series with said cascade connected transistors and said source, means connecting a first transistor in said first group to said first diode to impress the voltage drop across said diode between the emitter and base of said first transistor tending thereby to diminish the flow of current in the emitter-collector circuit of said first transistor, a second diode in series with a first of said compound connected transistors, means connecting said first compound connected transistor to said second diode to impress the voltage drop across said second diode between the emitter and base of said first compound connected transistor tending thereby to diminish the flow of current in the emitter-collector circuits of said first compound connected transistor, first bias means for other of said cascade connected transistors comprising a voltage divider energized by the voltage across said switch, means connecting said other of said cascade connected transistors to said first bias means to impress the voltage between the emitter and base of said other transistors tending to diminish the current flowing in the emitter-collector circuits of said other transistors, second bias means for the remaining of said compound connected transistors comprising individual voltage divider means for each of said remaining compound connected transistors, means connecting said individual voltage dividers to be energized by the voltage across said switch, means connecting the bases of the remaining of the said compound connected transistors to said individual voltage dividers to impress a voltage between the emitter and base of said other of said compound connected transistors tending to diminish the current flowing in the emitter-collector circuits of said other of said compound connected transistors, means for initiating conduction through said switch comprising a trigger transistor having its emitter and collector connected to the base and collector, respectively, of said first of said compound connected transistors, means for causing conduction between the emitter and collector of said trigger transistor, third diode means in series with the emitter and collector of said trigger transistor and said source, means connecting said trigger transistor to said diode means to impress the voltage drop across said third diode between the emitter and base of said first transistor tending to diminish the current flowing in the emitter-collector circuit of said trigger transistor.

6. In a transistor switch for controlling the flow of current from a source to a load, first and second groups of transistors, circuit means connecting the emitters and collectors of said first group in cascade circuit to control the flow of current from a source to a load, circuit means individually connecting each of said second group of transistors in compound relation to the transistors of said first group, a first nonlinear resistance means connected in series with said cascade connected transistors and said source, means connecting a first transistor in said first group to said first resistance means to impress the voltage drop across said first resistance means between the emitter and base of said first transistor tending thereby to diminish the flow of current in the emitter-collector circuit of said first transistor, a second nonlinear resistance means connected in series with a first of said compound connected transistors, means connecting said first compound connected transistor to said second resistance means between the emitter and base of said first compound connected transistor tending thereby to diminish the flow of current in the emitter-collector circuit of said first compound connected transistor.

7. In a transistor switch for controlling the flow of current from a source to a load, first and second groups of transistors, circuit means connecting the emitters and collectors of said first group in cascade circuit to control the flow of current from a source to a load, circuit means individually connecting each of said second group of transistors in compound relation to the transistors of said first group, first and second resistance means each having a nonlinear volt ampere characteristic to present a high resistance to leakage currents and a low resistance to load currents, said first resistance means being connected in series with said cascade connected transistors and said source, means connecting a first transistor in said first group to said first resistance means to impress the voltage drop across said first resistance means between the emitter and base of said first transistor tending thereby to diminish the flow of current in the emitter-collector circuit of said first transistor, said second resistance means being connected in series with a first of said compound connected transistors, means connecting said first compound connected transistor to said second resistance means between the emitter and base of said first compound connected transistor tending thereby to diminish the flow of current in the emitter-collector circuit of said first compound connected transistor.

References Cited in the file of this patent

UNITED STATES PATENTS

| | | |
|---|---|---|
| 2,629,834 | Trent | Feb. 24, 1953 |
| 2,663,806 | Darlington | Dec. 22, 1953 |
| 2,663,830 | Oliver | Dec. 22, 1953 |
| 2,665,845 | Trent | Jan. 12, 1954 |
| 2,773,200 | Guggi | Dec. 4, 1956 |
| 2,835,829 | Sourgens et al. | May 20, 1958 |
| 2,858,456 | Royer | Oct. 28, 1958 |
| 2,864,904 | Jensen | Dec. 16, 1958 |
| 2,972,684 | Elliot et al. | Feb .21, 1961 |
| 2,972,685 | Baude | Feb. 21, 1961 |

FOREIGN PATENTS

| | | |
|---|---|---|
| 1,174,488 | France | Mar. 11, 1959 |

OTHER REFERENCES

"Design of Transistor Regulated Power Supplies," by Middlebrook, November 1957, published in the Proceedings of the I.R.E.; Fig. 3 relied on, page 1504.

"Transistor Circuit Engineering," by Shea, 1957, published by John Wiley and Sons, New York, page 132.

"Transistors as Switching Devices," by R. C. Mundy, published in the Automatic Telephone & Electric Journal, July 1956, vol. 12, No. 3, page 176.

Hurley: Junction Transistor Electronics, John Wiley & Sons, 1958 (page 340 relied on).